United States Patent
Jo et al.

(10) Patent No.: US 12,027,401 B2
(45) Date of Patent: Jul. 2, 2024

(54) SEMICONDUCTOR SUBSTRATE ALIGNMENT DEVICE AND A SEMICONDUCTOR SUBSTRATE BONDING SYSTEM USING THE SAME

(71) Applicant: Samsung Electronics Co., Ltd., Suwon-si (KR)

(72) Inventors: Gwanghee Jo, Hwaseong-si (KR); Dongjoo Moon, Seongnam-si (KR); Siwoong Woo, Hwaseong-si (KR); Sunjung Kim, Seoul (KR); Donggil Shim, Bucheon-si (KR); Huijae Kim, Hwaseong-si (KR); Seungdae Seok, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 633 days.

(21) Appl. No.: 17/203,036

(22) Filed: Mar. 16, 2021

(65) Prior Publication Data

US 2022/0068688 A1 Mar. 3, 2022

(30) Foreign Application Priority Data

Sep. 1, 2020 (KR) .......................... 10-2020-0111052

(51) Int. Cl.
*H01L 21/68* (2006.01)
*G03F 7/00* (2006.01)
(Continued)

(52) U.S. Cl.
CPC .......... *H01L 21/68* (2013.01); *G03F 7/70775* (2013.01); *H01L 21/67742* (2013.01);
(Continued)

(58) Field of Classification Search
CPC ..... B26B 19/14; B26B 19/143; B26B 19/145; B26B 19/38; H01L 21/67092;
(Continued)

(56) References Cited

U.S. PATENT DOCUMENTS

| 7,948,034 B2 | 5/2011 | George et al. |
| 2002/0062787 A1 | 5/2002 | Hashizume et al. |

(Continued)

FOREIGN PATENT DOCUMENTS

| JP | 5018004 B2 | 9/2012 |
| JP | 5370903 B2 | 12/2013 |

(Continued)

OTHER PUBLICATIONS

Description for JP2009-194265 (Year: 2009).*

(Continued)

*Primary Examiner* — Sonya M Sengupta
(74) *Attorney, Agent, or Firm* — Harness, Dickey & Pierce, P.L.C.

(57) ABSTRACT

A semiconductor substrate alignment device includes: a lower chuck; a lower chuck driving unit; an upper chuck above and overlapping the lower chuck; observation windows in the upper chuck, imaging units respectively configured to irradiate light through the observation windows and to obtain images by detecting light reflected from the semiconductor substrates; a distance sensor configured to detect a distance between an edge of the lower chuck and an edge of the upper chuck; and a control unit configured to identify first and second alignment keys from images of first and second semiconductor substrates, determine an alignment error value of the first and second semiconductor substrates, and compensate for the alignment error value by driving the lower chuck driving unit.

20 Claims, 13 Drawing Sheets

(51) Int. Cl.
*H01L 21/677* (2006.01)
*H01L 21/683* (2006.01)

(52) U.S. Cl.
CPC .. *H01L 21/683* (2013.01); *H01L 2224/75701* (2013.01); *H01L 2224/75703* (2013.01)

(58) Field of Classification Search
CPC ......... H01L 21/67259; H01L 21/67742; H01L 21/68; H01L 21/681; H01L 21/683; H01L 2224/75701; H01L 2224/75703; H01L 2224/75744; H01L 2224/75745; H01L 2224/75753; G03F 7/70775
See application file for complete search history.

(56) References Cited

U.S. PATENT DOCUMENTS

| | | |
|---|---|---|
| 2005/0173057 A1 | 8/2005 | Suga et al. |
| 2007/0125495 A1 | 6/2007 | Nakamura et al. |
| 2009/0317960 A1 | 12/2009 | Izumi |
| 2010/0206454 A1 | 8/2010 | Maeda et al. |
| 2014/0182761 A1 | 7/2014 | Hayashi et al. |
| 2014/0261960 A1 | 9/2014 | Lin et al. |
| 2014/0349118 A1 | 11/2014 | Izumi et al. |
| 2015/0122414 A1 | 5/2015 | Phillips |
| 2015/0231873 A1 | 8/2015 | Okamoto et al. |
| 2015/0348933 A1 | 12/2015 | Gaudin |
| 2016/0336203 A1 | 11/2016 | Lindner |
| 2016/0336208 A1 | 11/2016 | Johnson et al. |
| 2017/0038552 A1 | 2/2017 | Georgiev |
| 2017/0038562 A1 | 2/2017 | Georgiev |
| 2017/0045065 A1 | 2/2017 | Jung-Kubiak et al. |
| 2017/0229336 A1 | 8/2017 | Thallner et al. |
| 2017/0243853 A1 | 8/2017 | Huang et al. |
| 2018/0076120 A1 | 3/2018 | Seddon et al. |
| 2018/0144967 A1 | 5/2018 | Dragoi |
| 2018/0150952 A1 | 5/2018 | Sah et al. |

FOREIGN PATENT DOCUMENTS

| | | | |
|---|---|---|---|
| JP | 2014-167472 | * | 9/2014 |
| JP | 2014-167472 A | | 9/2014 |
| KR | 10-2014-0086351 A | | 7/2014 |
| KR | 10-2016-0006436 A | | 1/2016 |
| KR | 10-2018-0055118 A | | 5/2018 |

OTHER PUBLICATIONS

Description for JP2014-167472 (Year: 2014).*
Description for KR2016-0006436 (Year: 2016).*
Description for KR2018-0055118 (Year: 2018).*

* cited by examiner

A

SEMICONDUCTOR SUBSTRATE ALIGNMENT DEVICE AND A SEMICONDUCTOR SUBSTRATE BONDING SYSTEM USING THE SAME

CROSS-REFERENCE TO RELATED APPLICATION(S)

This application claims benefit of priority to Korean Patent Application No. 10-2020-0111052 filed on Sep. 1, 2020 in the Korean Intellectual Property Office, the disclosure of which is incorporated herein by reference in its entirety.

BACKGROUND

1. Field

Some example embodiments relate to a semiconductor substrate alignment device and a semiconductor substrate bonding system using the same.

2. Description of Related Art

In developing a semiconductor having a three-dimensional connection structure, it is beneficial to precisely bond two semiconductor wafers to each other as extremely precise bonding of the two semiconductor wafers to each other may facilitate the formation of a semiconductor device having a smaller size while having a better performance and which may be manufactured with higher reliability. Various methods of bonding the two semiconductor wafers are being developed, as there is room for further improvement in terms of precision.

SUMMARY

Some example embodiments may provide a semiconductor substrate alignment device in which semiconductor substrates are bonded to each other with improved alignment precision, and a semiconductor substrate bonding system using the same.

According to some example embodiments, a semiconductor substrate alignment device may include: a lower chuck configured to support a first semiconductor substrate, the first semiconductor substrate including a first alignment key on an upper surface of the first semiconductor substrate; a lower chuck driving unit configured to adjust an alignment position of the first semiconductor substrate; an upper chuck above and overlapping the lower chuck, the upper chuck configured to hold a second semiconductor substrate including a second alignment key on a lower surface of the second semiconductor substrate, the upper chuck including first and second observation windows configured to expose an upper surface of the second semiconductor substrate, first and second imaging units respectively configured to irradiate transmitted light through the first and second observation windows and to obtain images by detecting measured light reflected from the semiconductor substrates; a distance sensor configured to detect a distance between an edge of the lower chuck and an edge of the upper chuck; and a control unit configured to identify the first and second alignment keys from the images of the first and second semiconductor substrates, determine an alignment error value of the first and second semiconductor substrates, and compensate for the alignment error value by driving the lower chuck driving unit.

According to some example embodiments, a semiconductor substrate alignment device may include: a first chuck configured to receive a first semiconductor substrate having a first alignment key; a first driving unit configured to adjust an alignment position of the first semiconductor substrate; a second chuck configured to receive a second semiconductor substrate opposing the first semiconductor substrate and having a second alignment key is loaded; a plurality of observation windows in a region of the second chuck overlapping that of the second semiconductor substrate, a plurality of imaging units respectively configured to irradiate transmitted light through the plurality of observation windows and to obtain images by detecting measured light reflected from the first and second semiconductor substrates; a distance sensor configured to detect a distance between an edge of the first chuck and an edge of the second chuck; and a control unit configured to identify the first and second alignment keys from the images of the first and second semiconductor substrates, calculate an alignment error value of the first and second semiconductor substrates, and compensate for the alignment error value by driving the first driving unit.

According to some example embodiments, a semiconductor substrate bonding system may include: a first chuck configured to receive a first semiconductor substrate having a first alignment; a first driving unit configured to adjust an alignment position of the first semiconductor substrate; a second chuck configured to receive a second semiconductor substrate opposing the first semiconductor substrate and having a second alignment key; a plurality of observation windows in a region of the second chuck overlapping that of the second semiconductor substrate; a plurality of imaging units configured to irradiate transmitted light through the plurality of observations windows and to obtain images by detecting measured light reflected from the first and second semiconductor substrates; a distance sensor configured to detect a distance between an edge of the first chuck and an edge of the second chuck; first and second pressing units respectively at the centers of the first and second chucks, and respectively configured to press the centers of the first and second semiconductor substrates such that the first and second semiconductor substrates are brought into contact with each other and spontaneous bonding propagates between the first and second semiconductor substrates; and a control unit configured to identify the first and second alignment keys from the images of the first and second semiconductor substrates, calculate an alignment error value of the first and second semiconductor substrates, compensate for the alignment error value by driving the first driving unit, and instigate the bonding of the first and second semiconductor substrates to each other.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
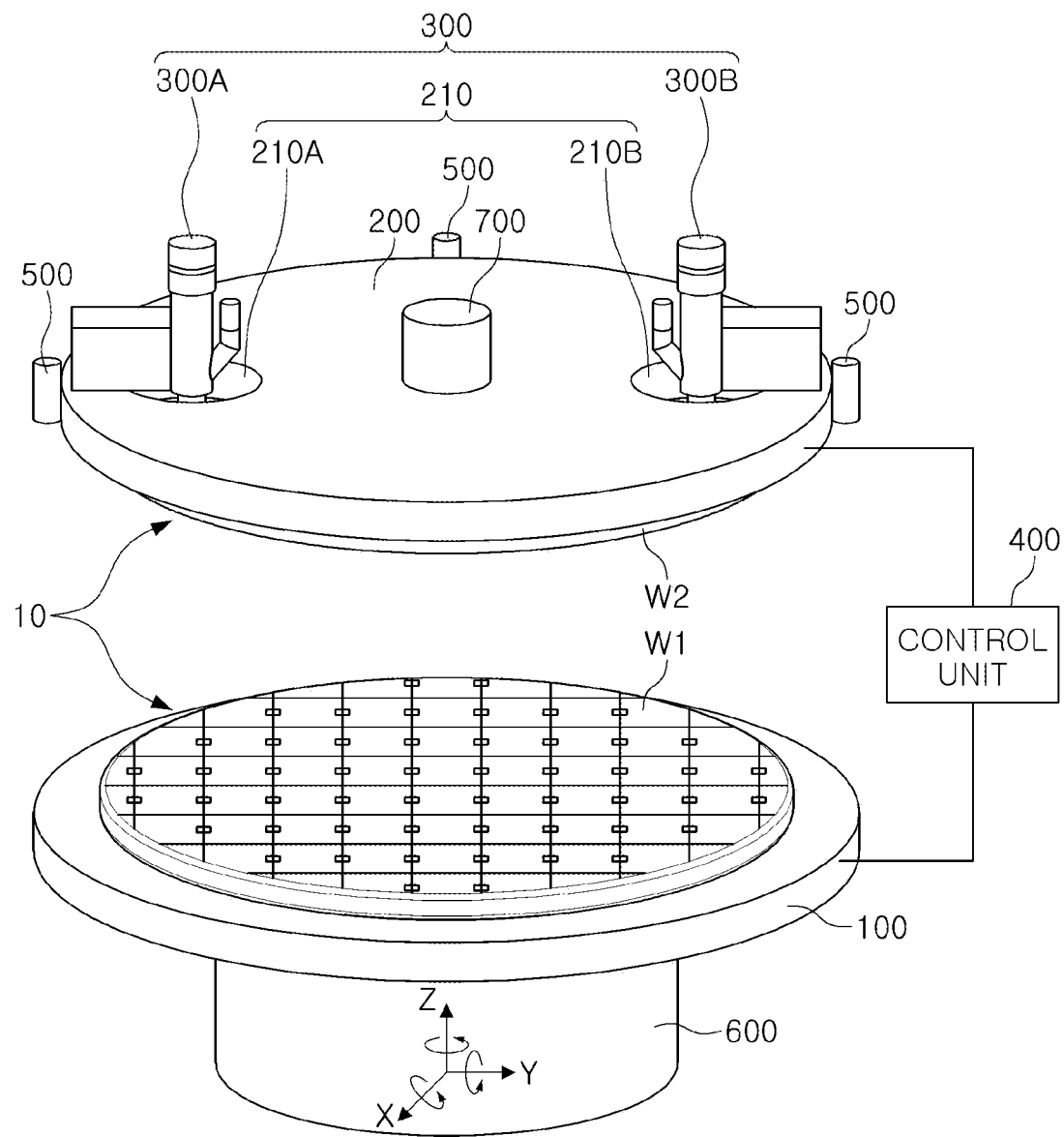
FIG. 1 is a schematic view of a semiconductor substrate bonding system according to some example embodiments.

Hereinafter, some example embodiments will now be described in detail with reference to the accompanying drawings. Example embodiments, however, may be embodied in various different forms, and should not be construed as being limited to only the illustrated embodiments. In the following drawings, the same reference numerals refer to the elements, and the sizes of various components are exaggerated for clarity and brevity.

Spatially relative terms, such as "lower," "under," and "above," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under," other elements or features would then be oriented "above" the other elements or features. Thus, the device may be otherwise oriented (rotated 90 degrees or at other orientations) and the spatially relative descriptors used herein interpreted accordingly.

Although the terms "first," "second," "third," etc., may be used herein to describe various elements, components, regions, layers, and/or sections, these elements, components, regions, layers, and/or sections, should not be limited by these terms. These terms are only used to distinguish one element, component, region, layer, or section, from another region, layer, or section. Thus, a first element, component, region, layer, or section, discussed below may be termed a second element, component, region, layer, or section, without departing from the scope of this disclosure.

Figure 2:
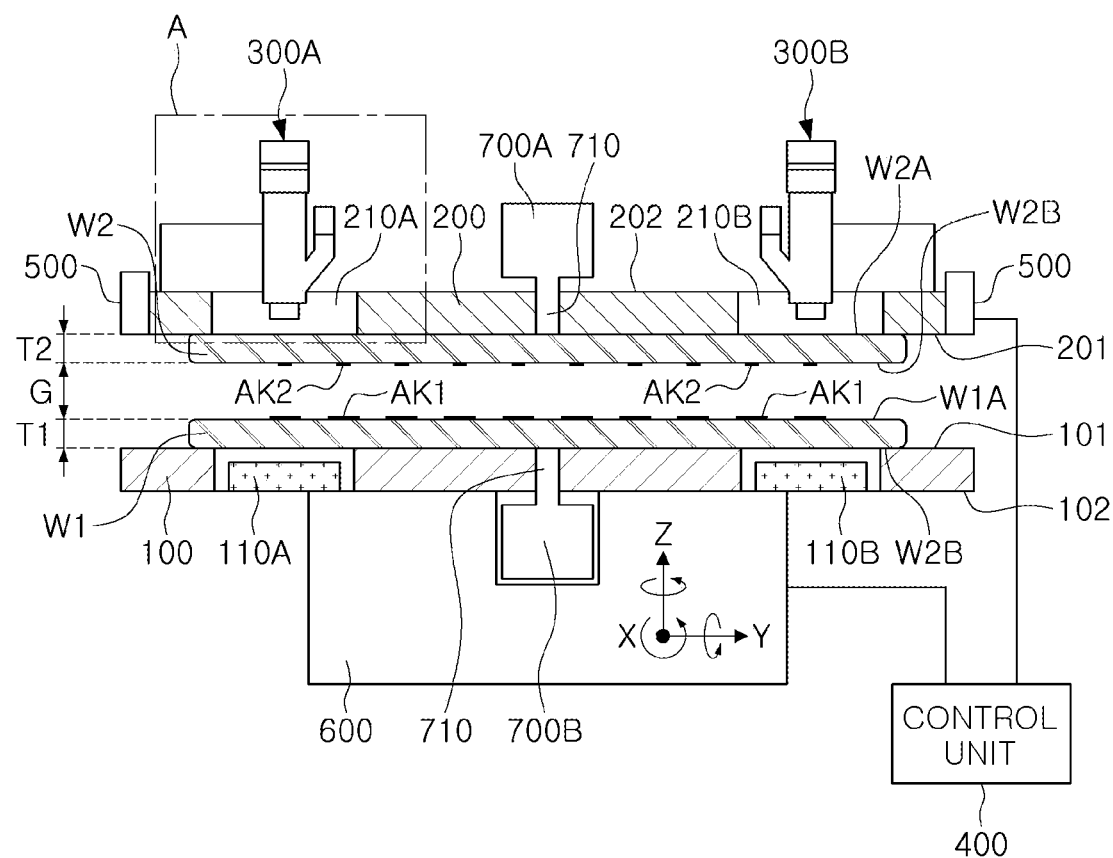
FIG. 2 is a side cross-sectional view of FIG. 1.
Figure 3A:
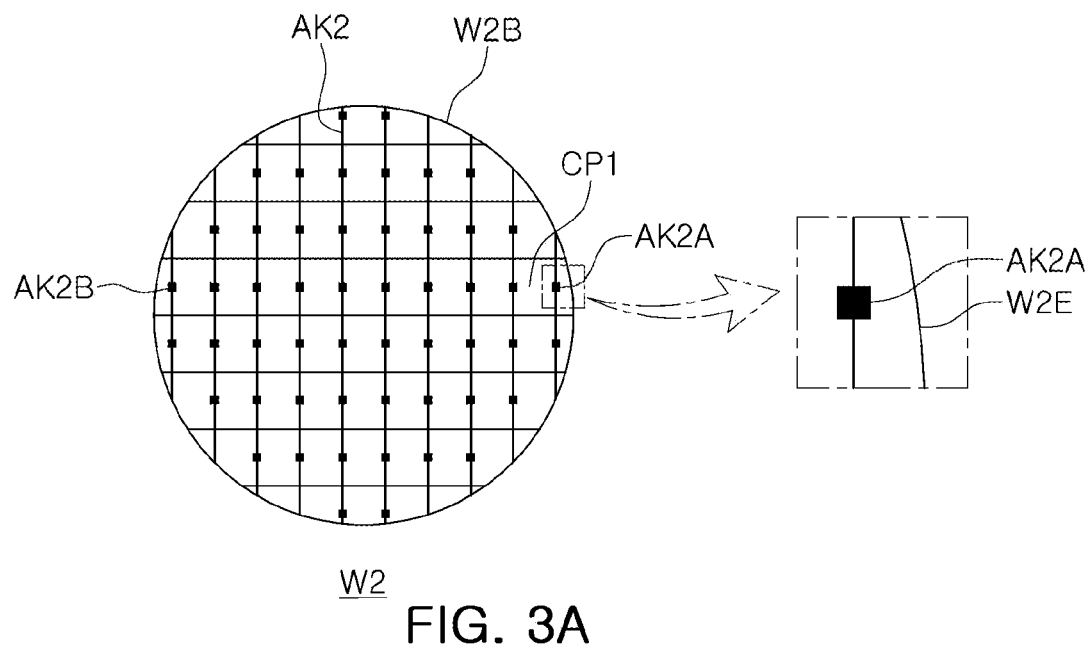
FIGS. 3A and 3B are views respectively illustrating first and second alignment keys of first and second semiconductor substrates of FIGS. 1 and 2.
Figure 3B:
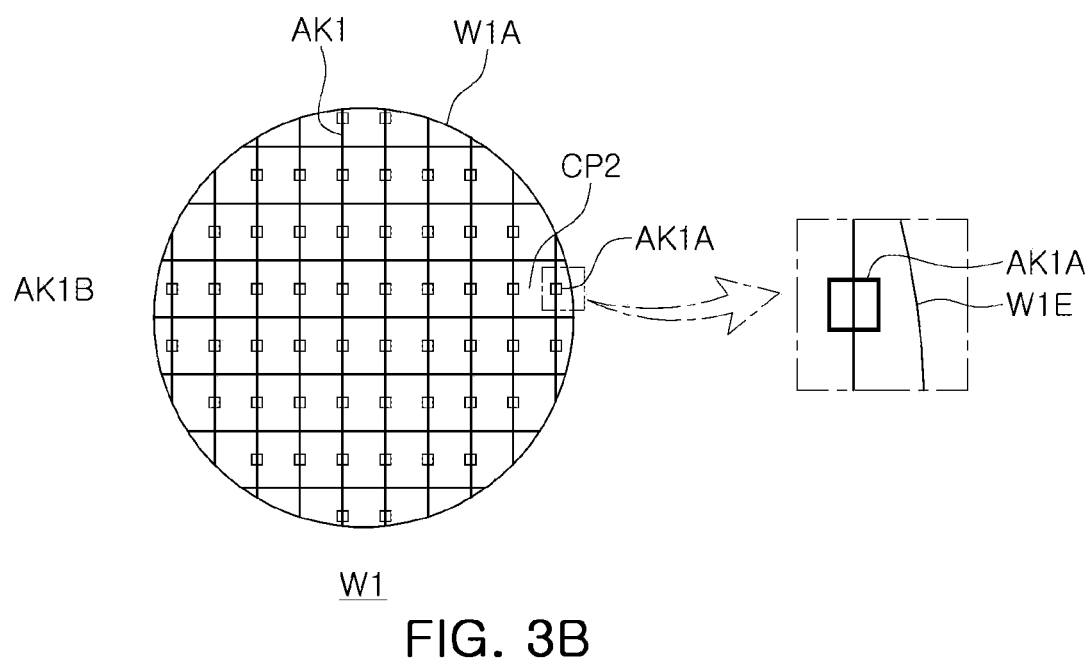
Figure 4:
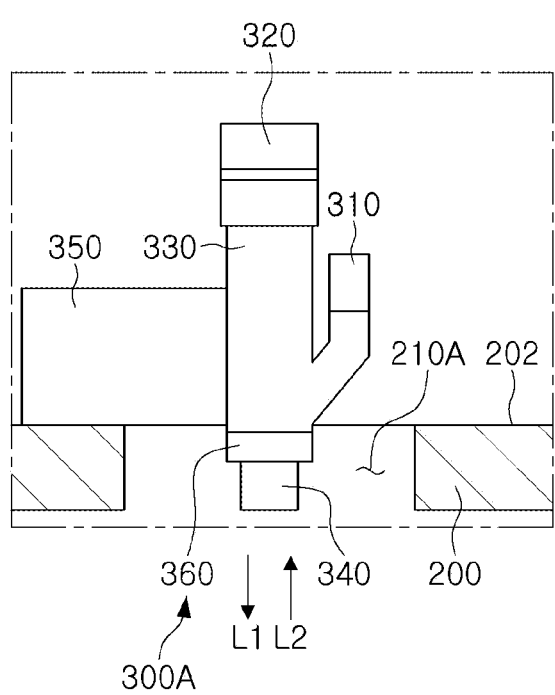
FIG. 4 is an enlarged view of portion A of FIG. 2.

A semiconductor substrate alignment device and a semiconductor substrate bonding system according to some example embodiments are described with reference to FIGS. 1 through 4. FIG. 1 is a schematic view of the semiconductor substrate bonding system according to an exemplary embodiment in the present disclosure; and FIG. 2 is a side cross-sectional view of FIG. 1; FIGS. 3A and 3B are views each first and second alignment keys of first and second semiconductor substrates of FIG. 2; and FIG. 4 is an enlarged view of portion A of FIG. 2.

Referring to FIGS. 1 and 2, a semiconductor substrate bonding system 1 according to some example embodiments may include a semiconductor substrate alignment device 10 and a pressing unit 700. The semiconductor substrate alignment device 10 may include: a lower chuck 100; an upper chuck 200 disposed above the lower chuck 100; an imaging unit 300 disposed on the upper chuck 200 to obtain images of first and second semiconductor substrates W1 and W2; a control unit 400 controlling each component of the semiconductor substrate bonding system 1; and a distance sensor 500 measuring a distance between the lower chuck 100 and the upper chuck 200. The semiconductor substrate alignment device 10 may refer to a configuration of the semiconductor substrate bonding system 1 excluding the pressing unit 700 bonding the first and second semiconductor substrates W1 and W2 to each other. The following description describes the semiconductor substrate bonding system 1, and omits a separate description of the semiconductor substrate alignment device 10. The provided example embodiment describes a case in which the imaging unit 300 is disposed on the upper chuck 200, but the example embodiments are not limited to this position, for example, the imaging unit 300 may be modified to be disposed on the lower chuck 100.

Referring to FIGS. 1 and 2, the first semiconductor substrate W1 may be disposed on an upper surface 101 of the lower chuck 100. The lower chuck 100 may seat the first semiconductor substrate W1 such that the first semiconductor substrate W1 does not unintentionally shift during the operation of the semiconductor substrate bonding system 1. For example, the lower chuck 100 may be a vacuum chuck suctioning the first semiconductor substrate W1 by vacuum, and/or may be one of various types of chucks on which the first semiconductor substrate W1 may be seated. For example, the lower chuck 100 may include a pattern (e.g., a rim to hold a substrate) and/or an electrostatic chuck. The lower chuck 100 may have the upper surface 101 wider than the first semiconductor substrate W1 to allow the first semiconductor substrate W1 to be sufficiently seated thereon. The first semiconductor substrate W1 disposed on the lower chuck 100 may be a semiconductor substrate. The semiconductor substrate may include a circular wafer. The first semiconductor substrate W1 may be a silicon wafer. An upper surface W1A of the first semiconductor substrate W1 may be a bonding surface to be bonded to the second semiconductor substrate W2, on which a first alignment key AK1 may be disposed.

A first and/or second light source unit 110A and 110B, configured to irradiate light to the first semiconductor substrate W1, may be disposed to correspond to a lower portion of the imaging unit 300 of the upper surface 101 of the lower chuck 100. For example, each of the first and second light source units 110A and 110B may be disposed on an optical axis of the imaging unit 300. The first and second light source units 110A and 110B may supplement an amount of light when the amount of light irradiated from the imaging unit 300 is insufficient. The first and second light source units 110A and 110B may be configured to emit a wavelength band light that is transmittable through the semiconductor substrates W1 and/or W2. In some example embodiments, the first and second light source units 110A and 110B may be omitted.

A driving unit 600 may be disposed on a lower surface 102 of the lower chuck 100. The driving unit 600 may include a six-axis stage and may thus allow the lower chuck 100 to be moved or rotated along X, Y, and Z-axes. Therefore, the driving unit 600 may move the lower chuck 100 on which the first semiconductor substrate W1 is disposed to align the first semiconductor substrate W1 and the second semiconductor substrate W2 with each other. For example, the driving unit 600 may include one or more actuators, motors, and/or solenoids configured to position, rotate, and/or tilt the lower chuck 100 such that the first semiconductor substrate W1 and the second semiconductor substrate W2 are aligned with each other.

The upper chuck 200 may be disposed above the lower chuck 100 to face the upper surface 101 of the lower chuck 100. The second semiconductor substrate W2 to be bonded to the first semiconductor substrate W1 may be disposed on a lower surface 201 of the upper chuck 200. The upper chuck 200 may be a vacuum chuck suctioning the second semiconductor substrate W2 by vacuum. However, the upper chuck 200 is not limited to this vacuum chuck, and may be one of various types of chucks on which the second semiconductor substrate W2 may be seated. The distance sensor 500 configured to measure the distance between the upper chuck 200 and the lower chuck 100 may be disposed on and/or around the upper chuck 200.

The upper chuck 200 may have the lower surface 201 wider than the second semiconductor substrate W2 to allow the second semiconductor substrate W2 to be sufficiently seated thereon. The upper chuck 200 may have a smaller radius than the lower chuck 100 to allow the distance sensor 500, disposed therearound, to identify the upper surface 101 of the lower chuck 100. The second semiconductor substrate W2 disposed on the upper chuck 200 may be a semiconductor substrate and/or may include a circular wafer. The second semiconductor substrate W2 may comprise an infrared (IR) and/or near-infrared transmitting material. For example, the second semiconductor substrate W2 may be a silicon wafer. A lower surface W2B of the second semiconductor substrate W2 may be a bonding surface to be bonded to the first semiconductor substrate W1, on which a second alignment key AK2 may be disposed.

Observation windows 210 passing through the lower surface 201 and upper surface 202 of the upper chuck 200 may be disposed in at least two portions of the upper chuck 200. Each observation window 210 is a region in which the imaging unit 300 may capture images of the first and second semiconductor substrates W1 and W2. The observation window 210 may be formed as a through-hole passing through the upper chuck 200, and an upper surface W2A of the second semiconductor substrate W2 may thus be exposed through a bottom surface of the observation window 210. However, the observation window 210 is not limited to this structure, and in some example embodiments, the observation window 210 may be modified to have a structure in which a transparent material cover is disposed in and/or on the through-hole.

Referring to FIG. 3A, the second alignment key AK2 may be disposed on the lower surface W2B of the second substrate W2. Referring to FIG. 3B, the first alignment key AK1 may be disposed on the upper surface W1A of the first substrate W1. The first and second alignment keys AK1 and AK2 may be disposed for respective unit elements CP1 and CP2. However, the first and second alignment keys AK1 and AK2 are not limited to these arrangements, and may be, for example, limitedly disposed only on some unit elements. The first alignment key AK1 and the second alignment key AK2 may be disposed to correspond to each other on the first and second semiconductor substrates W1 and W2 and to be paired with each other. For example, the first semiconductor substrate W1 and the second semiconductor substrate W2 may be aligned with each other when the corresponding first alignment key AK1 and second alignment key AK2 are paired and aligned with each other. The first alignment key AK1 and the second alignment key AK2 may comprise a material that is reflective and/or opaque to a wavelength of light captured by the camera 300. The first alignment key AK1 and the second alignment key AK2 may comprise the same or a different material. The first alignment keys AK1 may have substantially the same shape as each other, but are not limited thereto, and may have shapes different from each other within a range allowed in a process. Similarly, the second alignment keys AK2 may have substantially the same shape as each other, but are not limited thereto, and may have shapes different from each other within the range allowed in a process. For example, though the first alignment key AK1 and the second alignment key AK2 are illustrated as a rectangular ring and a quadrangle, the shapes of the first alignment key AK1 and the second alignment key AK2 are not so limited, and may include, for example, rings, polygons, rounded, ovular and/or circular shapes. The imaging unit 300 may capture an image of at least two regions close to an edge W1E of the first semiconductor substrate W1 and spaced apart from each other, and transmit the image in which the first alignment keys AK1A and AK1B are imaged to the control unit 400. In addition, the imaging unit 300 may capture an image of at least two regions close to an edge W2E of the second semiconductor substrate W2 and spaced apart from each other, and transmit the image in which the second alignment keys AK2A and AK2B are imaged to the control unit 400.

The distance sensor 500 may be disposed around the upper chuck 200, and may detect the distance between the upper surface 101 of the lower chuck 100 and the lower surface 201 of the upper chuck 200. According to some example embodiments, the distance sensor 500 may measure the distance between the upper chuck 200 and the lower chuck 100 by irradiating an electromagnetic wave to the lower chuck 100 and analyzing the electromagnetic wave reflected therefrom. In some example embodiments, the distance sensor 500 may include three or more sensors arranged around the upper chuck 200. Therefore, the control unit 400 may measure a parallel degree between the upper chuck 200 and the lower chuck 100 based on a measured value of the distance sensor 500. In addition, the control unit 400 calculates the distance between the upper chuck 200 and the lower chuck 100 and subtracts thicknesses T1 and T2 of the first and second semiconductor substrates W1 and W2, thereby calculating a gap G between the first and second semiconductor substrates W1 and W2. In some example embodiments, the thickness T1 and T2 may be pre-stored in a memory accessible to the control unit 400 and/or determined at some point before the positioning of the lower chuck 100 to a first distance, as described below.

Referring to FIG. 2, the imaging unit 300 may include a first imaging unit 300A and a second imaging unit 300B respectively disposed in and/or above the first and second observation windows 210A and 210B of the upper chuck 200. The first and second imaging units 300A and 300B may be disposed symmetrically to each other with respect to the center of the upper chuck 200. The first and second imaging units 300A and 300B have the same structure as each other, and the description below thus describes only the first imaging unit 300A.

Referring to FIG. 4, the first imaging unit 300A may include: a body portion 330 forming its appearance; a light source 310 configured to emit transmitted light L1; an objective lens 340; a camera 320 configured to capture the images of the first and second semiconductor substrates W1 and W2; and first and second moving stages 350 and 360.

The objective lens 340 may be disposed at the front end of the body portion 330. For example, the objective lens 320 may be disposed in a direction, relative to the body portion 330, in which the transmitted light L1 is irradiated. The light source 310, from which the transmitted light L1 is emitted, and the camera 320, which captures measured light L2 reflected from the emitted transmitted light L1 from the surfaces of the first and second semiconductor substrates W1 and W2, may each be disposed at the rear end of the body portion 330. The transmitted light L1 may include a wavelength band that is transmittable through the semiconductor substrates W1 and/or W2. In some example embodiments, the rear end of the body portion 330 may include one or more branches. In the case where the body portion 330 includes 2 or more branches, the light source 310 and the camera 320 may be disposed in different branches of the body portion 330. In some example embodiments, the camera 320 may include a light source, and the light source 310 may be omitted. The first moving stage 350 may connect the body portion 330 to the upper chuck 200 and may move the body portion 330 along the X, Y, and Z axes. For example, the first moving stage 360 may be fixed to the upper surface of the upper chuck 200. In addition, the second moving stage 360 may be disposed on the front end of the body portion 330, and may move the objective lens 340 up and down along an optical axis (Z-axis) of the transmitted light L1 within a first observation window 210A to focus the image captured by the camera 320. The second moving stage 360 may use a driving device having a fast response to a small displacement compared to the first moving stage 350. For example, the second moving stage 360 may include at least one of a piezo motor and/or a step motor, and may finely move the objective lens 340 at a very high speed in the optical axis direction from which the measured light L2 is incident. Therefore, the first imaging unit 300A may be moved up, down, front, back, left, and right within the first observation window 210A and capture a differently focused image.

The light source 310 may emit a uniform amount of the transmitted light L1. In some example embodiments, the transmitted light L1 may be light of a near-infrared and/or infrared wavelength band, and/or the camera 320 may be an infrared and/or near-infrared camera capable of capturing the transmitted light L1 and the measured light L2.

Figure 6:
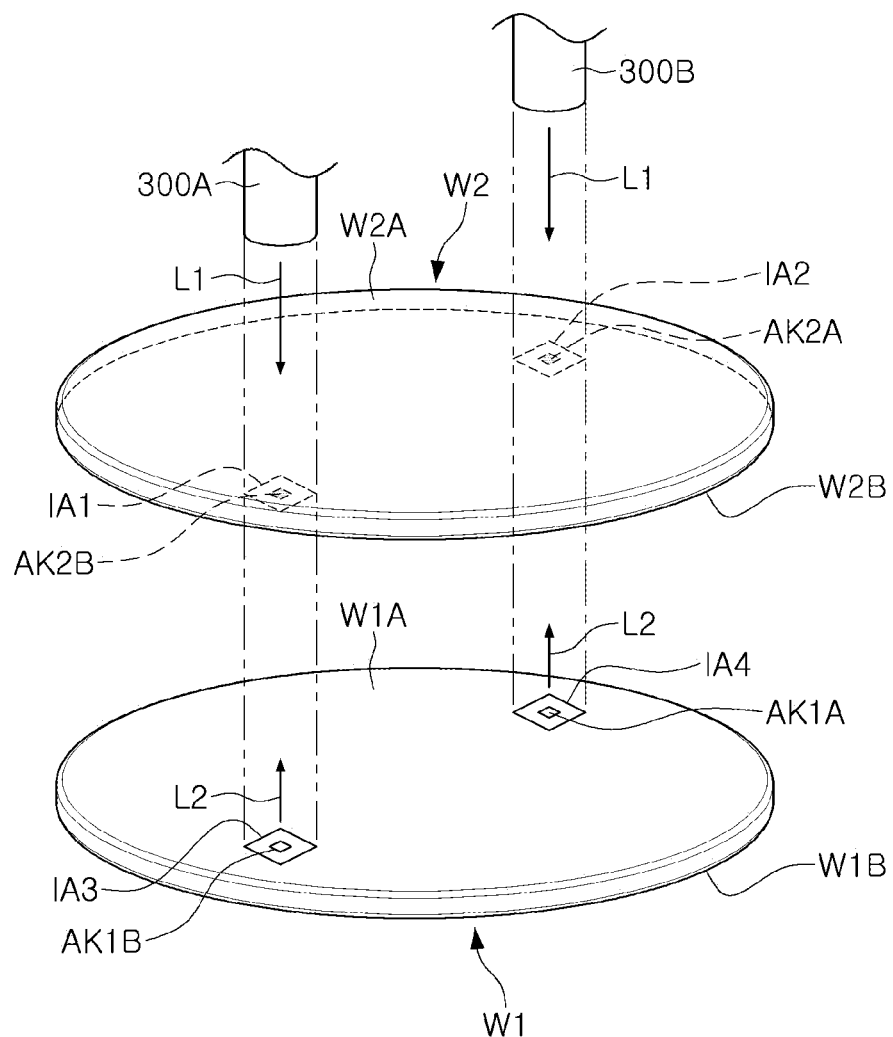
FIG. 6 is a view illustrating a process in which images of the first and second semiconductor substrates are imaged by the imaging unit.

Referring to FIGS. 4 and 6, the transmitted light L1 emitted from the first imaging unit 300A may pass through the second semiconductor substrate W2 and be irradiated to the first semiconductor substrate W1. In addition, the measured light L2, reflected from the first semiconductor substrate W1. may pass through the second semiconductor substrate W2 and be condensed into the first imaging unit 300A. Therefore, the first imaging unit 300A may capture the image of the first semiconductor substrate W1 even though the second semiconductor substrate W2 is disposed between the first imaging unit 300A and the first semiconductor substrate W1. The first imaging unit 300A may capture the first and second semiconductor substrates W1 and W2 multiple times and transmit obtained images IA1 and IA3 to the control unit 400. Similarly, the second imaging unit 300B may image the first and second semiconductor substrates W1 and W2 multiple times and transmit obtained images IA2 and IA4 to the control unit 400.

The illustrated example embodiment shows a case in which the first imaging unit 300A uses one camera 320. However, the example embodiments are not so limited, and, for example, the first imaging unit 300A and/or the second imaging unit 300B may use a plurality of cameras in some example embodiments.

Figure 5:
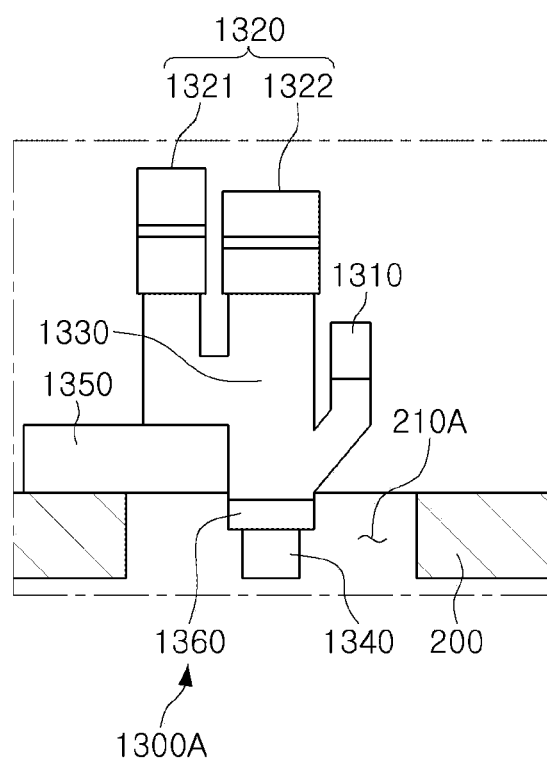
FIG. 5 is a modified example of an imaging unit of FIG. 4.

FIG. 5 is a modified example of first imaging unit 300A of FIG. 4. FIG. 5 shows a case in which a first imaging unit 1300A uses a plurality of cameras 1320. Among the plurality of cameras 1320, a first camera 1321 may be a low magnification infrared camera, and a second camera 1322 may be a high magnification infrared camera. The first camera 1321 may capture a low-resolution image which may be used for a rough alignment to be described below. The second camera 1322 may capture a high-resolution image which may be used for a fine alignment to be described below.

The control unit 400 is for controlling an overall operation of the semiconductor substrate bonding system 1. For example, the control unit 400 may include a processor such as a central processing device (CPU), a graphic processing device (GPU), a microprocessor, an application specific integrated circuit (ASIC) and field programmable gate arrays (FPGA), and may include non-transitory memory storing various data and/or instructions for the operation of the semiconductor substrate bonding system 1. Generally speaking, the term "non-transitory," as used herein, is a feature of the medium itself (e.g., as tangible, and not a signal) as opposed to a feature of the data storage persistency (e.g., RAM vs. ROM).

The control unit 400 may control the capture the images of the first and second semiconductor substrates W1 and W2 by controlling the imaging unit 300, calculate an alignment error value of the first and second semiconductor substrates W1 and W2 based on the captured image, and correct the alignment error value by driving the driving unit 600. In addition, the control unit 400 may control the bonding of the first semiconductor substrate W1 with the second semiconductor substrate W2, the alignment error value of which is compensated for.

For example, the control unit 400 may calculate a primary alignment error value of the first and second semiconductor substrates W1 and W2 based on the image of the first semiconductor substrate W1 (hereinafter referred to as, the 'first image') obtained from an initial capturing (hereinafter, the 'first capturing') and the image of the second semiconductor substrate W2 (hereinafter, the 'second image'), and may roughly align the first and second semiconductor substrates W1 and W2. In addition, the control unit 400 may calculate a secondary alignment error value of the first and second semiconductor substrates W1 and W2 based on the image of the second semiconductor substrate W2 (hereinafter, the 'third image') and the image of the first semiconductor substrate W1 (hereinafter, the 'fourth image'), which are obtained by capturing the first semiconductor substrate W1 (hereinafter, the 'second capturing') in a state of being brought closer to the second semiconductor substrate W2 after the first capturing, and may finely align the first and second semiconductor substrates W1 and W2. These arrangements will be explained in further detail below.

The rough alignment is a temporary alignment process in which the first and second semiconductor substrates W1 and W2 are roughly but quickly aligned with each other, before being finely aligned with each other. The first capturing used for the rough alignment may be performed based on standard values of the first and second semiconductor substrates W1 and W2. For example, the standard values may be determined and/or provided in advance. The standard value may be based on the thickness and diameter of each of the first and second semiconductor substrates W1 and W2, an offset value of a map on which the first and second alignment keys AK1 and AK2 are disposed, and the like. The control unit 400 may estimate the position of one or more first and second alignment keys AK1 and AK2 disposed at a position closest to a current position of the first imaging unit 300A, based on the standard values of the first and second semiconductor substrates W1 and W2, and may move the first imaging unit 300A to a corresponding position to capture the images of the first and second semiconductor substrates W1 and W2 including the first and second alignment keys AK1 and AK2.

The first capturing of the first image may be performed in such a manner that only the first substrate W1 is loaded on the lower chuck 100 and then imaged, in a state in which the upper chuck 200 and the lower chuck 100 are disposed to overlap each other. The second image may be captured in such a manner that the first and second semiconductor substrates W1 and W2 are respectively loaded on the lower chuck 100 and the upper chuck 200 and then imaged. In some example embodiments, the first capturing is performed not based on actual positions of the first and second alignment keys AK1 and AK2 of the first and second semiconductor substrates W1 and W2, but based on the known standard values, and thus may not capture images detailed enough to finely align the first and second alignment keys AK1 and AK2. However, the first and second images of the first capturing may be used to confirm rough central positions of the first and second alignment keys AK1 and AK2, roughly align the first and second semiconductor substrates W1 and W2, and/or allow the first and second alignment keys AK1 and AK2 to be positioned within one field of view (FOV) of the first imaging unit 300A. Therefore, it is possible to roughly identify the centers of the first and second alignment keys AK1 and AK2 by using the first capturing. It is then possible to dispose the centers of the first and second alignment keys AK1 and AK2 to be close to each other roughly but at a high speed by moving the lower chuck 100 on which the first semiconductor substrate W1 is disposed.

The fine alignment is a process in which the positions of the first and second alignment keys AK1 and AK2 temporarily aligned with each other by the rough alignment are corrected to be finely aligned with each other. The second capturing used for the fine alignment may be performed after the lower chuck 100 is raised to allow the first semiconductor substrate W1 to be positioned at a first distance closer to the lower portion of the second semiconductor substrate W2. It is possible to check whether the gap G between the first and second semiconductor substrates W1 and W2 is the first distance by the distance sensor 500. The first distance may include a distance at which spontaneous bonding propagation may be performed between the first and second semiconductor substrates W1 and W2 when the centers of the first and second semiconductor substrates W1 and W2 are approached to each other. For example, the first distance may be about 10 μm to about 200 μm. In some example embodiments, the bonding propagation may be insufficiently performed when the first distance is more than 200 μm. In the inverse, when the first distance is less than 10 μm, the bonding propagation may be excessively performed and a void may thus occur in a propagated portion.

The second capturing may be performed by respectively focusing on the upper surface W1A of the first semiconductor substrate W1 and the lower surface W2B of the second semiconductor substrate W2 using the second moving stage 360 of the imaging unit 300. Accordingly, the third and fourth images captured in the second capturing may obtain finer images of the first and second alignment keys AK1 and AK2 compared to the first and second images captured in the first capturing. Therefore, the fine alignment may finely align the first and second alignment keys. However, the fine alignment may also be achieved by the process in which the lower chuck 100 is moved to align the first alignment key AK1 to the second alignment key AK2, and the lower chuck 100 may be moved by the driving unit 600. Here, the first and second alignment keys AK1 and AK2 may not be aligned with each other within a target value at once by one movement of the lower chuck 100 due to the limitation of the driving unit 600. In this case, the process in which the images are captured and corrected may be repeated until the first and second alignment keys AK1 and AK2 are aligned to each other within the target value.

Referring to FIGS. 1 and 2, the first and second pressing units 700A and 700B may respectively be disposed on the centers of the lower chuck 100 and the upper chuck 200, and pressing pins 710 protruding from the upper surface 101 of the lower chuck 100 and the lower surface 201 of the upper chuck 200 may be moved to protrude from the upper surface 101 of the lower chuck 100 and the lower surface 201 of the upper chuck 200, respectively. The spontaneous bonding propagation may start in the central regions of the first and second semiconductor substrates W1 and W2, and the bonding may thus be sequentially performed in their circumferential directions when pressing the central regions of the first and second semiconductor substrates W1 and W2 using the pressing pins 710 after performing the fine alignment by bringing the first and second semiconductor substrates W1 and W2 close to each other by the first distance.

Therefore, the semiconductor substrate bonding system according to some example embodiments in the present disclosure may have improved alignment precision when bonding the semiconductor substrates to each other by including the above-described components.

The semiconductor substrate bonding system 1 of some example embodiments may identify the first and second alignment keys AK1 and AK2 respectively disposed on the first and second semiconductor substrates W1 and W2 in a state in which the lower chuck 100 and the upper chuck 200 are disposed to overlap each other, roughly align the first and second alignment keys AK1 and AK2 with each other, fine align the first and second alignment keys AK1 and AK2 with each other by raising the lower chuck 100, and then bond the first and second semiconductor substrates W1 and W2 to each other. Therefore, it is possible to perform the image capturing for identifying the first and second alignment keys AK1 and AK2 and the bonding between the first and second semiconductor substrates W1 and W2 at the same place. Accordingly, the lower chuck 100 may have a minimized movement in the process in which the first and second semiconductor substrates W1 and W2 are bonded to each other. Therefore, the first and second semiconductor substrates W1 and W2 may be bonded to each other with improved precision. However, the driving unit 600 moving the lower chuck 100 may tend to have a decreased movement precision as being moved with a long stroke due to a weight of the lower chuck 100. Therefore, in some example embodiments, the semiconductor substrates may be bonded to each other with improved alignment precision by minimizing the distance in which the driving unit 600 is moved.

Figure 7:
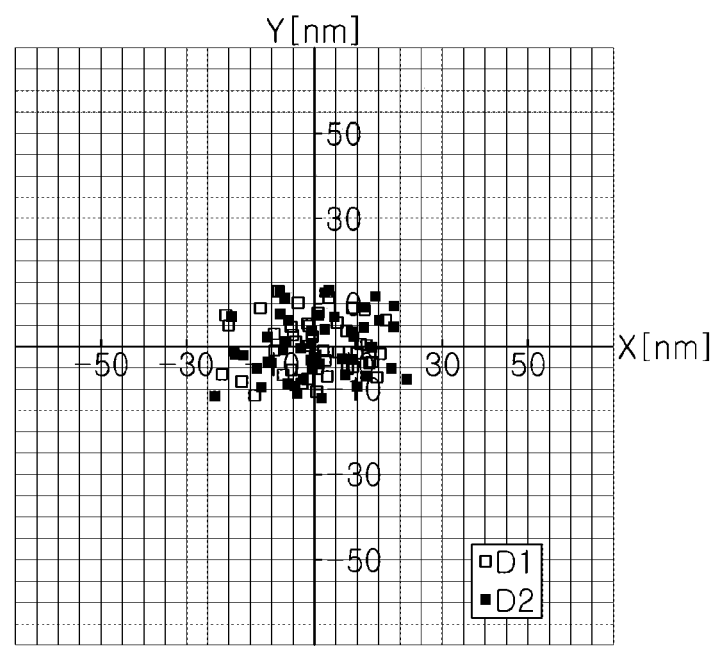
FIG. 7 is a graph illustrating alignment distribution of the first and second alignment keys aligned with each other by the semiconductor substrate bonding system according to some example embodiments.

FIG. 7 is a graph illustrating measurement of first and second alignment keys aligned with each other by the semiconductor substrate bonding system according to some example embodiments, and an alignment error of the measured first and second alignment keys.

In FIG. 7, D1 refers to an alignment error of the first and second alignment keys AK1 and AK2 captured by the first imaging unit 300A, and D2 refers to an alignment error of the first and second alignment keys AK1 and AK2 captured by the second imaging unit 300B.

The measurement was conducted 50 times, and D1 was measured to have a dispersion of ±23 nm or less with respect to the X-axis and a dispersion of ±12.5 nm or less with respect to the Y-axis. D2 was measured to have a dispersion of ±24 nm or less with respect to the X-axis, and a dispersion of ±12.5 nm or less with respect to the Y-axis. Therefore, it may be seen that both D1 and D2 are aligned with each other with very high alignment precision of a dispersion of less than ±25 nm.

Figure 8:
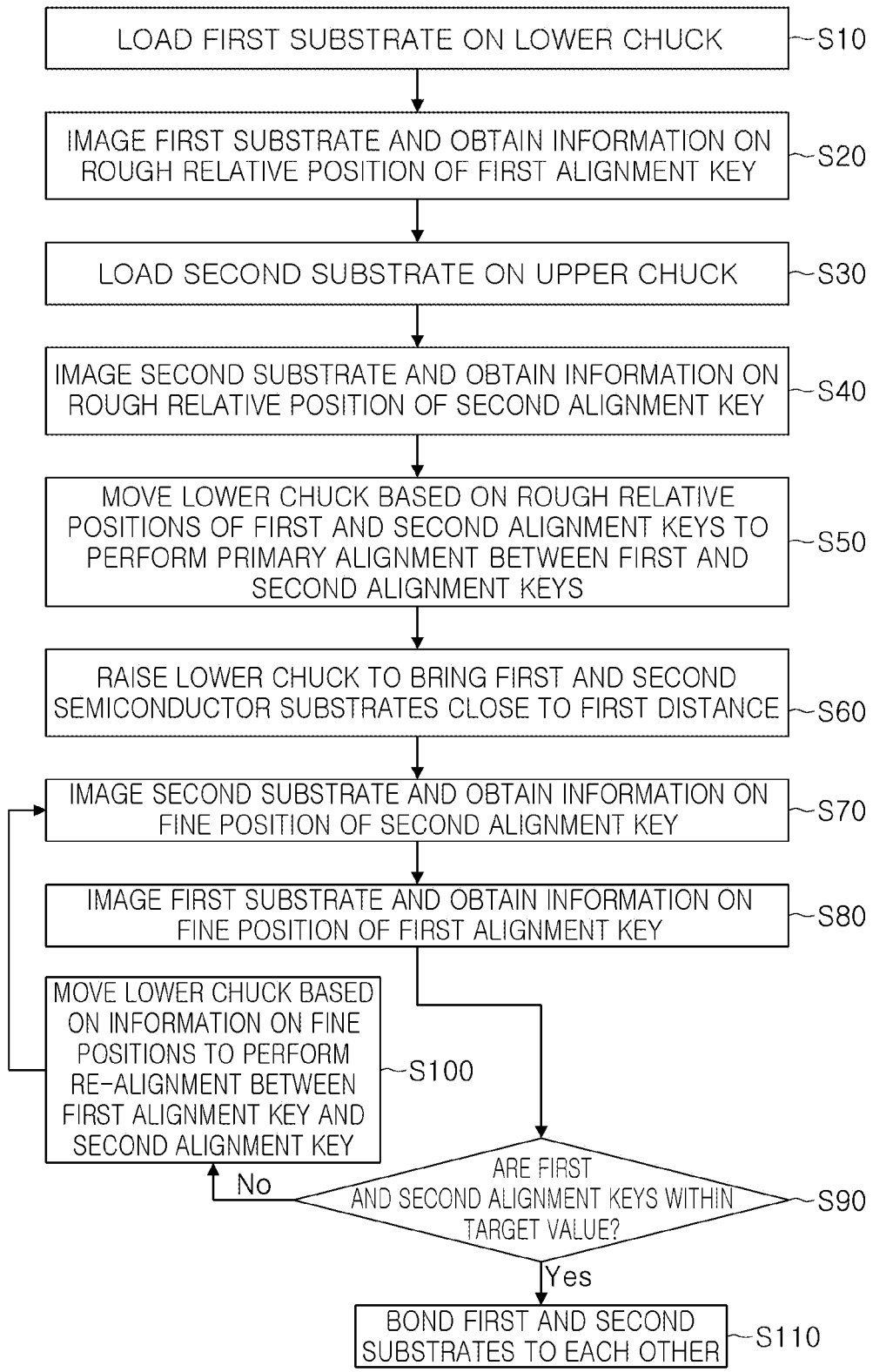
FIG. 8 is a flowchart schematically illustrating a bonding method of the semiconductor substrate bonding system according to some example embodiments.

Next, referring to FIGS. 8 through 21, the description describes a method in which semiconductor substrates are bonded to each other by the semiconductor substrate bonding system according to some example embodiments. FIG. 8 is a flowchart schematically illustrating a bonding method of the semiconductor substrate bonding system according to some example embodiments; and FIGS. 9 through 20 are views each schematically illustrating a bonding process of the semiconductor substrate bonding system according to some example embodiments. The first and second imaging units 300A and 300B may perform the same operation, and the description below thus describes only the operation of the first imaging unit 300A.

Figure 9:
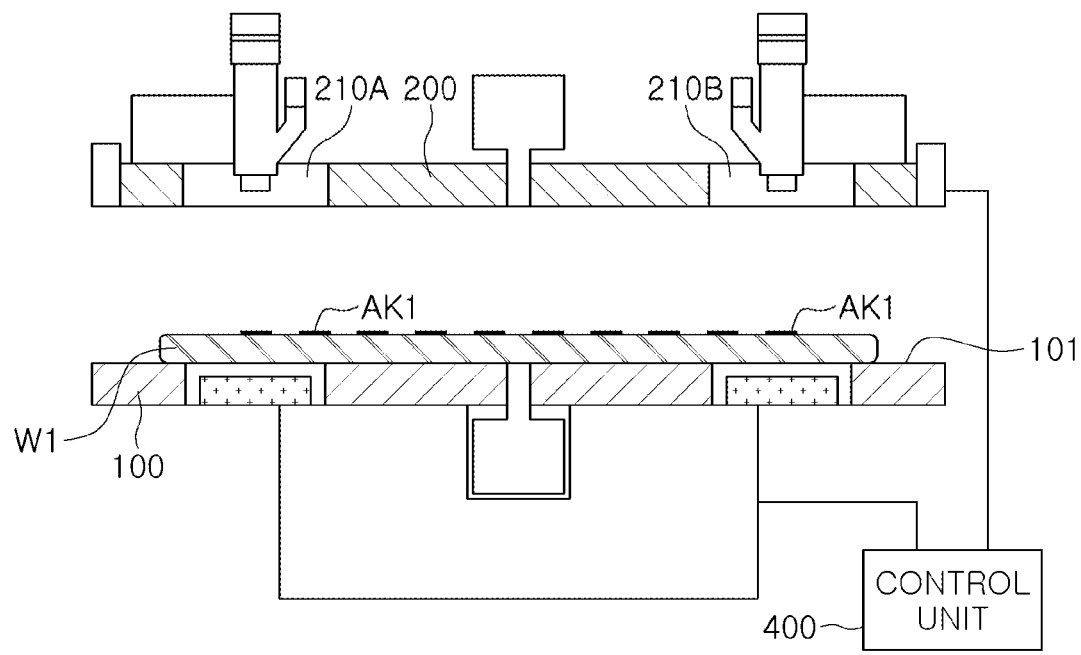
FIGS. 9 through 20 are views each schematically illustrating a bonding process of the semiconductor substrate bonding system according to some example embodiments.

Referring to FIGS. 8 and 9, the first semiconductor substrate W1 may be loaded on the upper surface 101 of the lower chuck 100 (S10).

Figure 10:
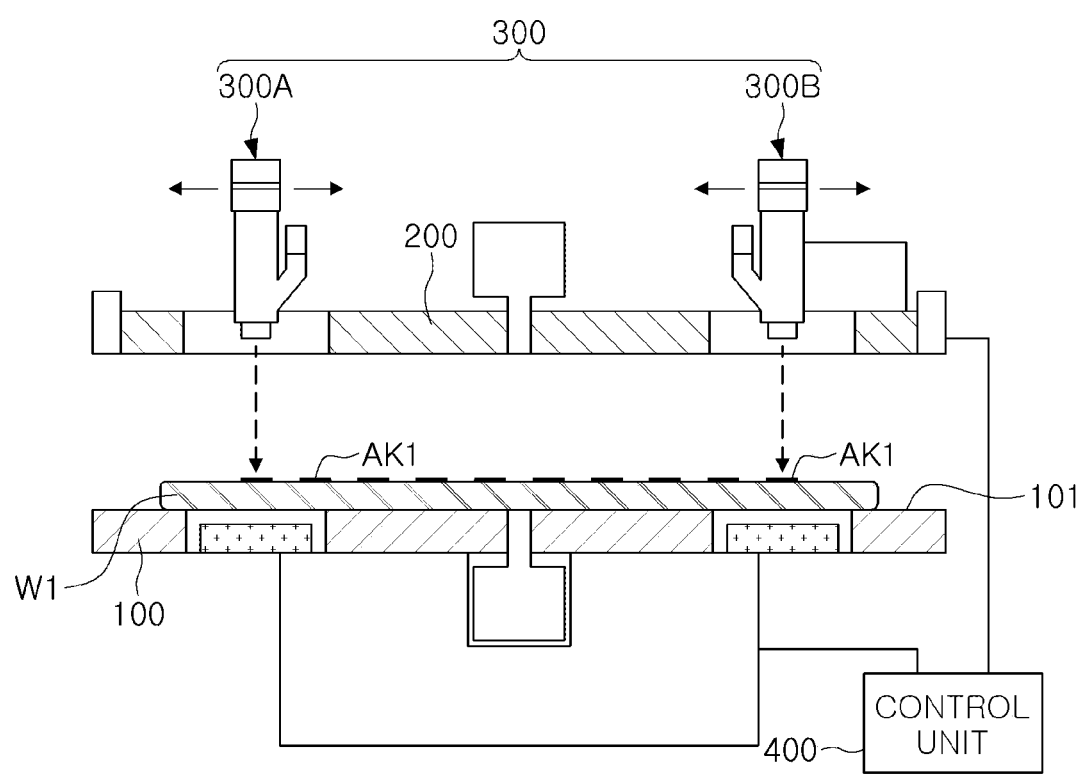
Figure 11:
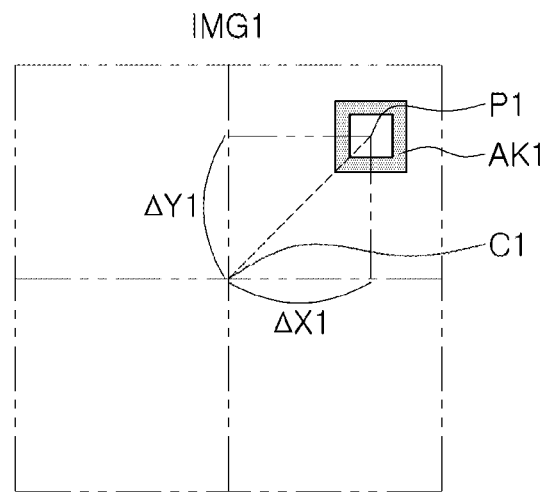

Referring to FIGS. 8, 10 and 11, the control unit 400 may capture the image of the first semiconductor substrate W1 and obtain information on a rough relative position of the first alignment key AK1 (S20). The control unit 400 may move the first imaging unit 300A to a first prediction point C1 at which the first alignment key AK1 closest to the first imaging unit 300A is estimated to be positioned, based on the standard value of the first semiconductor substrate W1, and may thus obtain a first image IMG1 by capturing the first semiconductor substrate W1. The control unit 400 may identify the first alignment key AK1 from the first image IMG1 and calculate a rough center P1 of the first alignment key AK1, thereby calculating rough relative positions $\Delta X1$ and $\Delta Y1$ of the first alignment key AK1 based on the first prediction point C1. The first image IMG1 is to identify the rough position of the first alignment key AK1. Therefore, the first image IMG1 does not have to be a high-resolution image, and may be a low-resolution image. It is possible to improve the speed and precision in identifying the first alignment key AK1 by using the low-resolution image.

Figure 12:
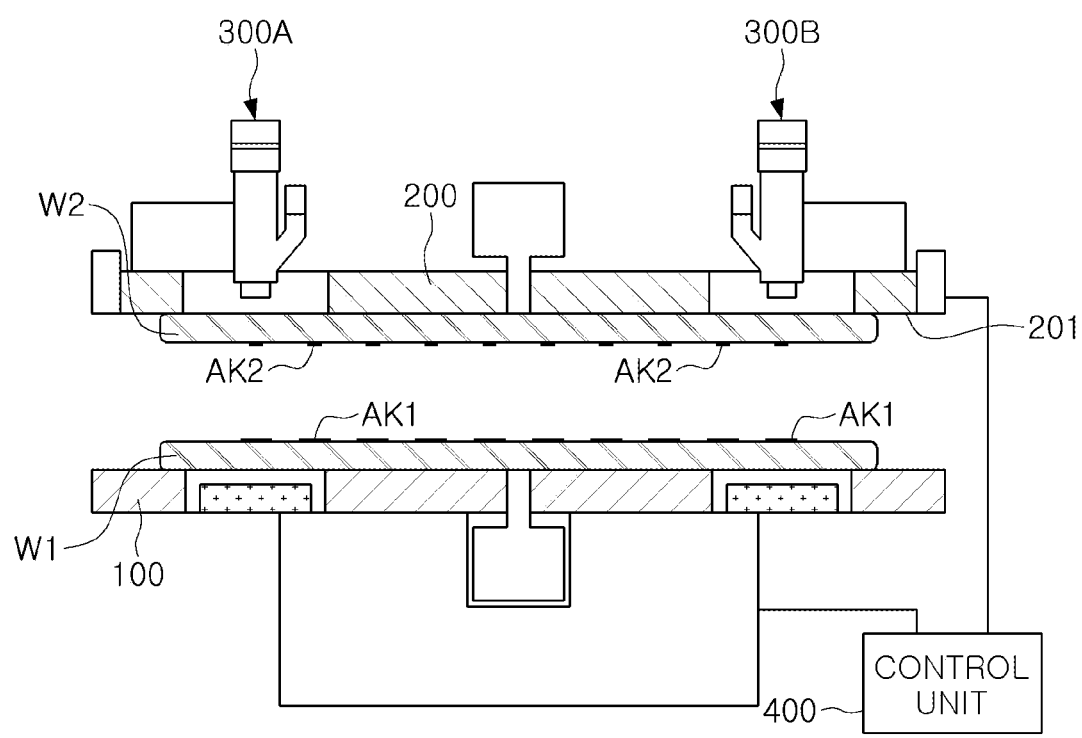

Referring to FIGS. 8 and 12, the second semiconductor substrate W2 may be loaded on the lower surface 201 of the upper chuck 200 (S30).

Figure 13:
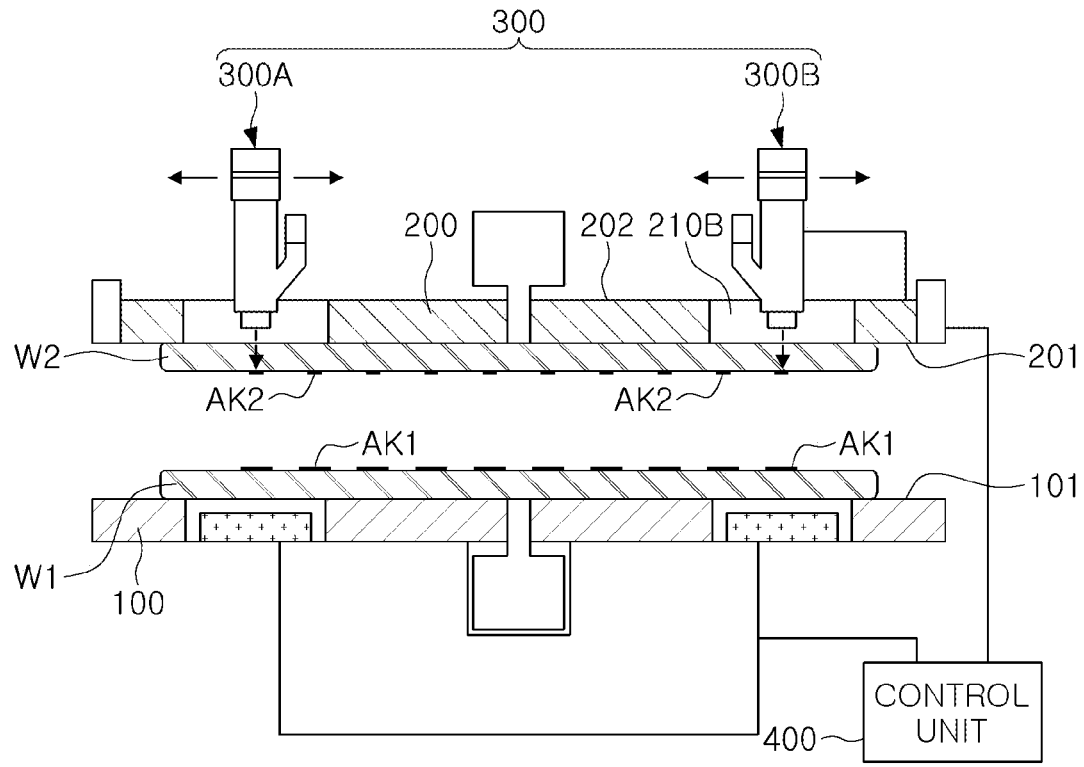
Figure 14:
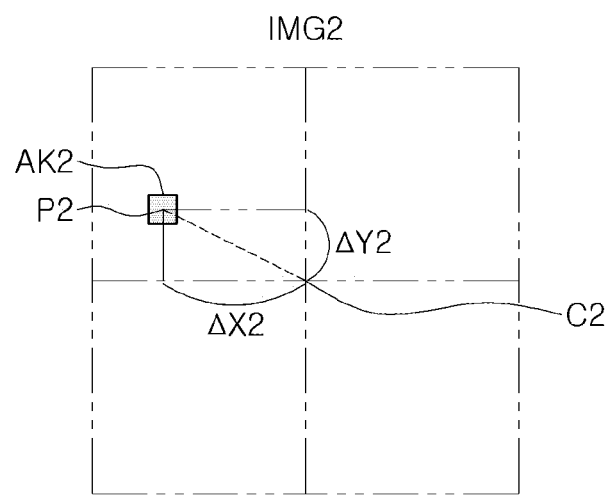

Referring to FIGS. 8, 13 and 14, the control unit 400 may capture the image of the second semiconductor substrate W2 and obtain information on a rough relative position of the second alignment key AK2 (S40). The control unit 400 may move the first imaging unit 300A to a second prediction point C2 at which the second alignment key AK2 closest to the first imaging unit 300A is estimated to be positioned, based on the standard value of the second semiconductor substrate W2, and may thus obtain a second image IMG2 by capturing the second semiconductor substrate W2. The control unit 400 may identify the second alignment key AK2 from the second image IMG2 and calculate a rough center P2 of the second alignment key AK2, thereby calculating rough relative positions $\Delta X2$ and $\Delta Y2$ of the second alignment key AK2 based on the second prediction point C2. The second image IMG2 is to identify the rough position of the second alignment key AK2. Therefore, the second image IMG2 does not have to be a high-resolution image, and may be a low-resolution image. It is possible to improve the speed and precision in identifying the second alignment key AK2 by using the low-resolution image.

Figure 15:
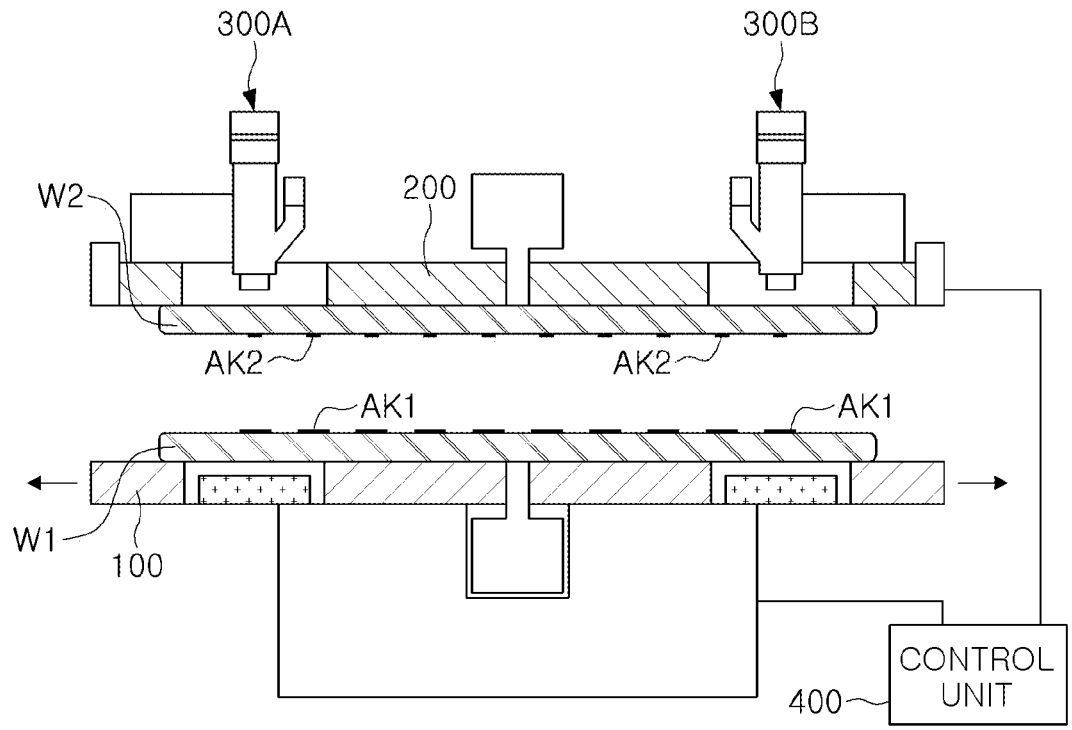

Referring to FIGS. 8 and 15, the control unit 400 may calculate a primary alignment error value based on the relative positions of the first and second alignment keys AK1 and AK2 and the first and second prediction points C1 and C2, which may be calculated in advance, and may perform a primary alignment (S50). The primary alignment, for example, may be the rough alignment process described above, in which the first and second semiconductor substrates W1 and W2 are temporarily aligned with each other roughly but quickly, before being finely aligned with each other. The control unit 400 may calculate the primary alignment error value of the first and second alignment keys AK1 and AK2, based on the relative positions of the first and second alignment keys AK1 and AK2 and the first and second prediction points C1 and C2, and may temporarily align the center P1 of the first alignment key AK1 and the center P2 of the second alignment key AK2 at a high speed by moving the lower chuck 100 to correct the primary alignment error value. The primary alignment may align both the first and second alignment keys AK1 and AK2 to be positioned within one field of view (FOV) of the first imaging unit 300A, and, therefore, may not finely align the centers P1 and P2 of the first and second alignment keys AK1 and AK2.

Figure 16:
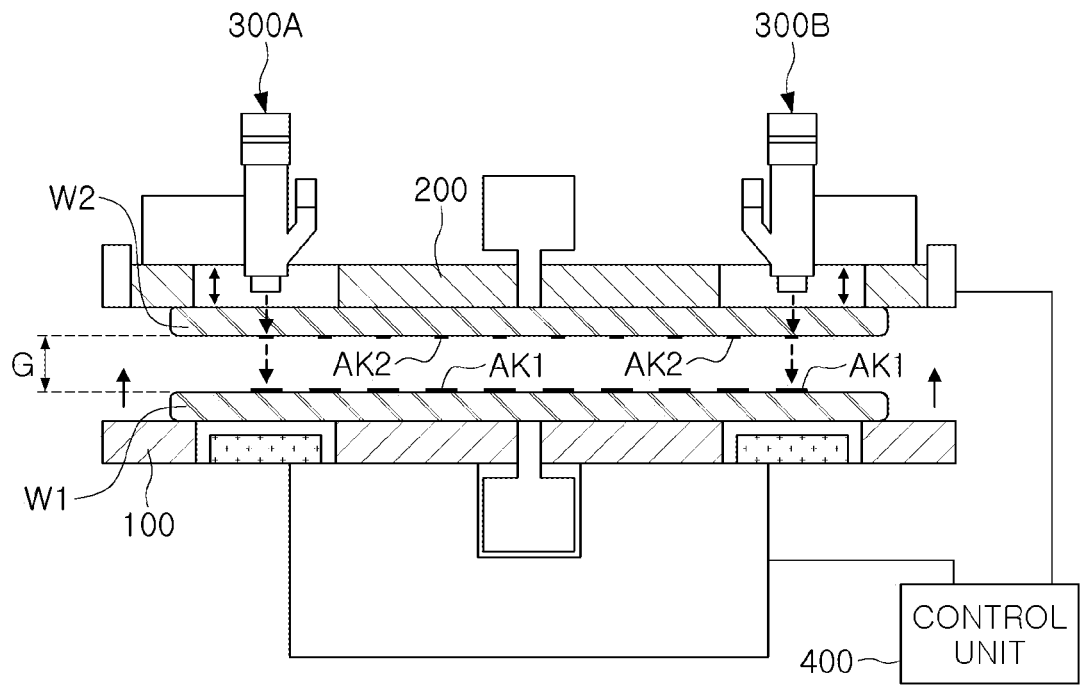
Figure 17A:
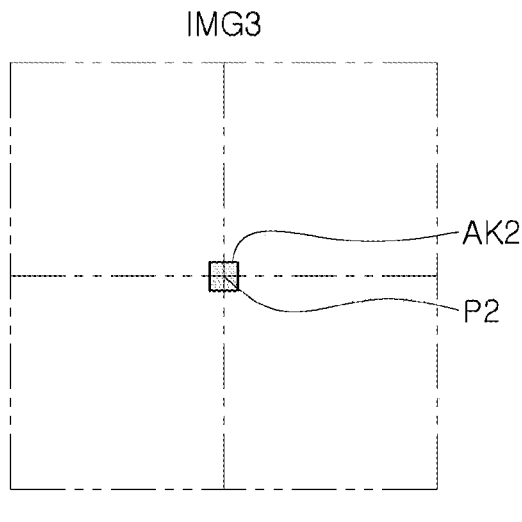
Figure 17B:
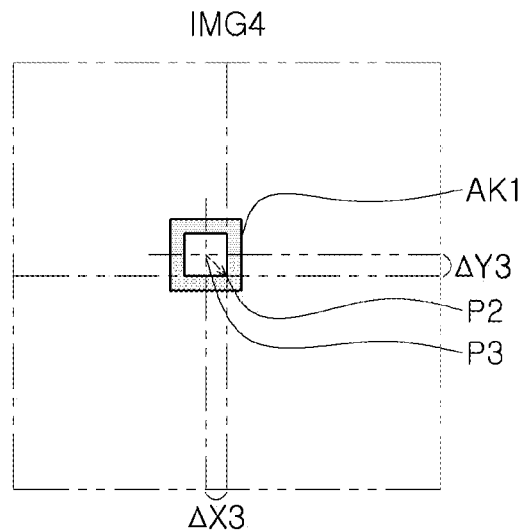

Referring to FIGS. 8 and 16, the control unit 400 may raise the lower chuck 100 to the first distance, bringing the first and second semiconductor substrates W1 and W2 close to each other (S60), such that the gap G, where the spontaneous bonding propagation may be performed between the first semiconductor substrate W1 and the second semiconductor substrate W2, is formed. It is possible to detect and/or determine the gap G between the first semiconductor substrate W1 and the second semiconductor substrate W2 by the distance sensor 500.

Referring to FIGS. 8, 16, 17A and 17B, the control unit 400 may focus on the second alignment key AK2 and obtain a third image IMG3 by capturing the second semiconductor substrate W2 (S70). In addition, the control unit 400 may focus on the first alignment key AK1 and obtain a fourth image IMG4 by capturing the first semiconductor substrate W1 (S80). The third and fourth images IMG3 and IMG4 may be high-resolution images. The first and second semiconductor substrates W1 and W2 may be disposed very closely to each other, and the control unit 400 may thus capture the high-resolution image of the first semiconductor substrate W1 projected onto the second semiconductor substrate W2. In this manner, the control unit 400 may obtain the images of the first and second alignment keys AK1 and AK2 captured within the one field of view (FOV). The control unit 400 may calculate relative positions $\Delta X3$ and $\Delta Y3$ of a center P3 of the first alignment key AK1 using the center P2 of the second alignment key AK2 as a reference value.

Figure 18:
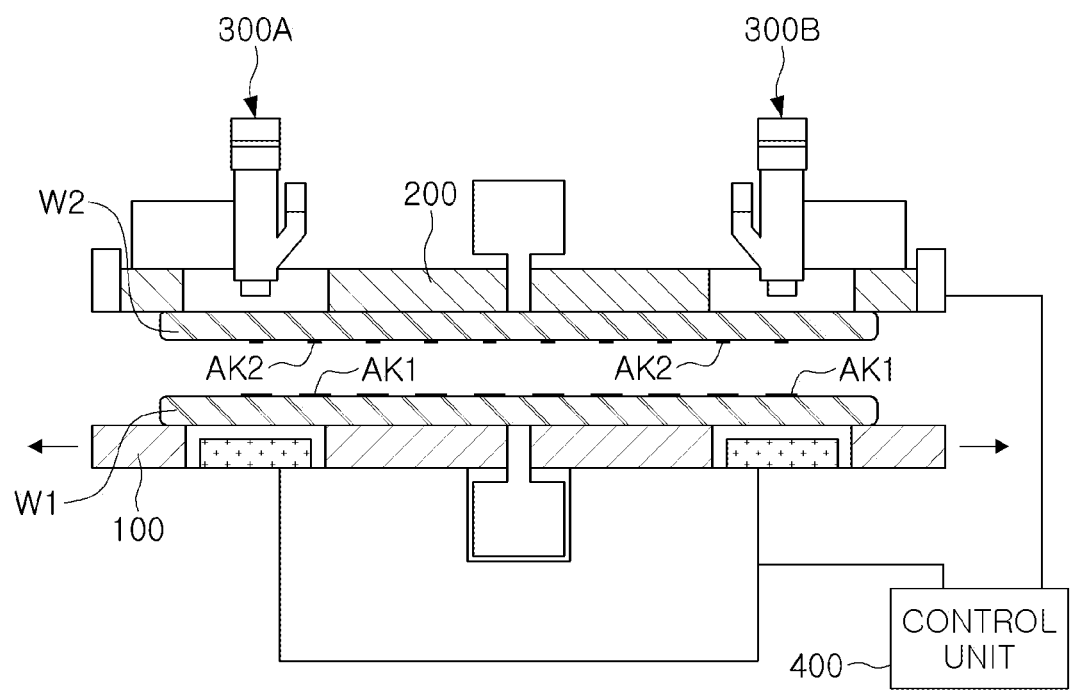
Figure 19:
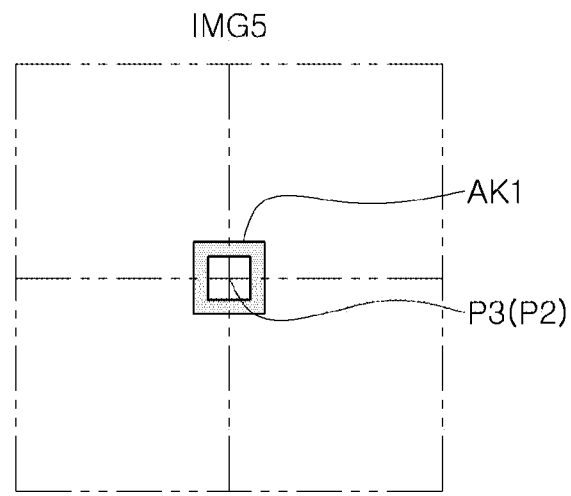

Referring to FIGS. 8, 18 and 19, the control unit 400 may determine the secondary alignment error value from the calculated relative positions $\Delta X3$ and $\Delta Y3$ of the center P3 of the first alignment key AK1, determine whether the secondary alignment error value is within a target value (S90), and bond the first and second semiconductor substrates W1 and W2 to each other when the secondary alignment error value is within the target value (S110). When the secondary alignment error value is out of the target value, the control unit 400 may move the lower chuck 100 to perform a secondary alignment between the first alignment key AK1 and the second alignment key AK2 (S100). The secondary alignment is the fine alignment described above. A fifth image IMG5 of FIG. 19 shows that the center P3 of the first alignment key AK1 is aligned to match the center P2 of the second alignment key after the secondary alignment is performed.

After performing the secondary alignment, the control unit 400 may capture the images of the first and second semiconductor substrates W1 and W2 to recalculate a third alignment error value, and determine whether the third alignment error value is within the target value (S90). When the third alignment error value is out of the target value, the control unit 400 may recalculate the alignment error value of the first and second semiconductor substrates W1 and W2, and may re-alignment the lower chuck 100 to compensate for the calculated alignment error value (S100). When the third alignment error value is within the target value, the control unit 400 may perform a subsequent process in which the first and second semiconductor substrates W1 and W2 are bonded to each other (S110). As described above, the control unit 400 may repeat the process of calculating an alignment error value and the feedback process of moving the lower chuck 100 to compensate for the calculated alignment error value, thereby aligning the centers P2 and P3 of the first and second alignment keys AK1 and AK2 to have an alignment error value within the target value.

Figure 20:
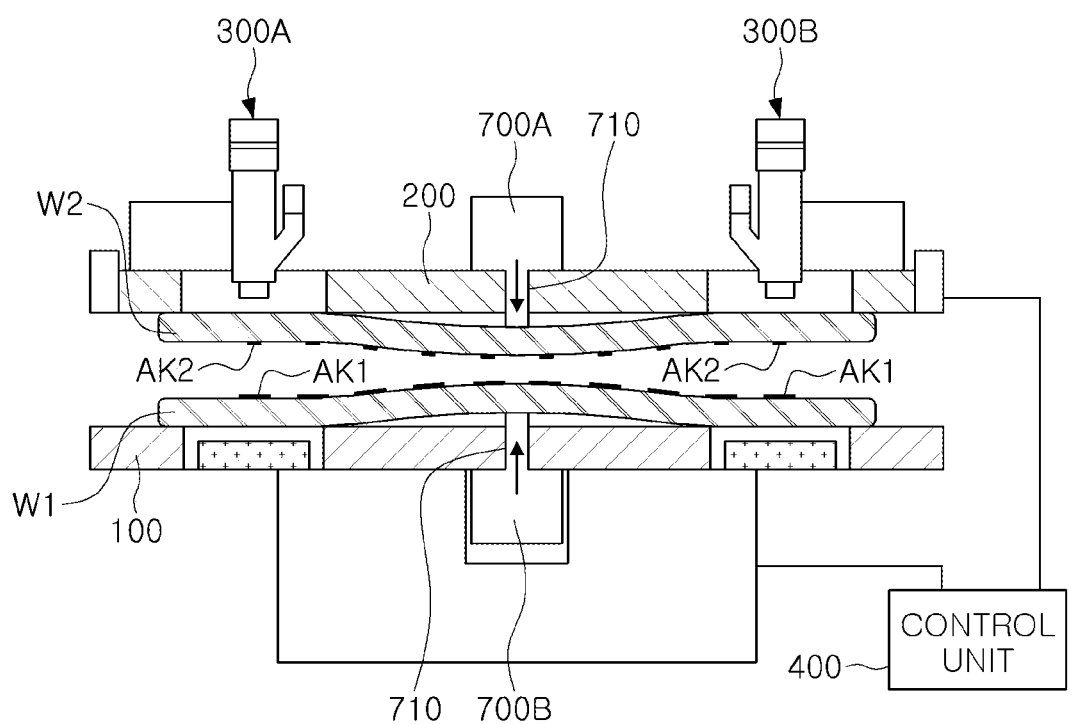

Referring to FIGS. 8 and 20, the control unit 400 may drive the first and second pressing units 700A and 700B, thereby moving the pressing pins 710 disposed in the centers of the upper chuck 200 and lower chuck 100 to protrude from the upper surface 101 of the lower chuck 100 and the lower surface 201 of the upper chuck 200, respectively. In this manner, the spontaneous bonding propagation may start in the central regions of the first and second semiconductor substrates W1 and W2, and the bonding may thus be sequentially performed in their circumferential directions.

As set forth above, the semiconductor substrate alignment device in which the semiconductor substrates are bonded to each other with the improved alignment precision by minimizing the movements of the first and second semiconductor substrates in such a manner that the first and second semiconductor substrates to be aligned with each other are imaged in a state of overlapping each other, and are then aligned with each other based on their captured images.

The present disclosure may also provide the semiconductor substrate bonding system in which the semiconductor substrates are bonded to each other with the improved alignment precision by minimizing the movements of the first and second semiconductor substrates in such a manner that in the process in which the first and second semiconductor substrates to be bonded to each other are aligned with each other, the first and second semiconductor substrates are imaged in a state of overlapping each other, and are then aligned with each other.

While some example embodiments have been shown and described above, it will be apparent to those skilled in the art that modifications and variations could be made without departing from the scope of the present disclosure as defined by the appended claims.

What is claimed is:

1. A semiconductor substrate alignment device comprising:
a lower chuck configured to support a first semiconductor substrate, the first semiconductor substrate including a first alignment key on an upper surface of the first semiconductor substrate;
a lower chuck driving unit configured to adjust an alignment position of the first semiconductor substrate;
an upper chuck above and overlapping the lower chuck, the upper chuck configured holding a second semiconductor substrate including a second alignment key on a lower surface of the second semiconductor substrate, the upper chuck including first and second observation windows configured to expose an upper surface of the second semiconductor substrate;
first and second imaging units respectively configured to irradiate transmitted light through the first and second observation windows and to obtain images by detecting measured light reflected from at least one of the first and second semiconductor substrates;
a distance sensor configured to detect a distance between an edge of the lower chuck and an edge of the upper chuck; and
a control unit configured to identify the first and second alignment keys from the images of the first and second semiconductor substrates, determine an alignment error value of the first and second semiconductor substrates, and compensate for the alignment error value by driving the lower chuck driving unit.

2. The semiconductor substrate alignment device of claim 1, wherein
the alignment error value includes a primary alignment error value and a secondary alignment error value, and
the control unit is configured to
obtain first and second images based on standard values of the first and second semiconductor substrates,
determine rough position values of the first and second alignment keys from the first and second images,
determine the primary alignment error value of the first and second semiconductor substrates based on the rough position values of the first and second alignment keys,
control the lower chuck driving unit to roughly align the first and second semiconductor substrates to compensate for the primary alignment error value,
control a position of the lower chuck to be closer to a first distance at which spontaneous bonding propagation is allowed to be performed between the first and second semiconductor substrates based on a distance value measured by the distance sensor,
obtain third and fourth images imaged by focusing on the upper surface of the first semiconductor substrate and the lower surface of the second semiconductor substrate,
determine fine position values of the first and second alignment keys from the third and fourth images,
determine the secondary alignment error value of the first and second semiconductor substrates based on the fine position values of the first and second alignment keys, and
control the lower chuck driving unit to finely align the first semiconductor substrate with the second semiconductor substrate by moving the lower chuck to compensate for the secondary alignment error value.

3. The semiconductor substrate alignment device of claim 1, wherein the first and second imaging units respectively include:
a body portion;
an objective lens at a front side of the body portion;
a near-infrared light source configured to emit the transmitted light through the objective lens;
an infrared camera configured to receive the measured light incident to the objective lens; and
a camera driving unit configured to drive the infrared camera along X, Y, and Z-axes.

4. The semiconductor substrate alignment device of claim 3, wherein the camera driving unit includes:

a first moving stage configured to drive the infrared camera along the X and Y-axes; and a second moving stage driving the infrared camera along the Z-axis, wherein the Z-axis is an optical axis direction of the measured light.

5. The semiconductor substrate alignment device of claim 4, wherein the second moving stage includes at least one of a piezo motor or a step motor.

6. The semiconductor substrate alignment device of claim 1, wherein the first and second semiconductor substrates are silicon wafers.

7. The semiconductor substrate alignment device of claim 2, wherein the first distance is in a range of 10 μm to 200 μm.

8. The semiconductor substrate alignment device of claim 1 further comprising:

first and second light source units on an upper surface of the lower chuck and on an optical axis of the first and second imaging units.

9. The semiconductor substrate alignment device of claim 8, wherein the first and second light source units are configured to irradiate near-infrared light.

10. A semiconductor substrate alignment device comprising:

a first chuck configured to receive a first semiconductor substrate having a first alignment key;

a first driving unit configured to adjust an alignment position of the first semiconductor substrate;

a second chuck configured to receive a second semiconductor substrate opposing the first semiconductor substrate and having a second alignment key;

a plurality of observation windows in a region of the second chuck overlapping that of the second semiconductor substrate;

a plurality of imaging units respectively configured to irradiate transmitted light through the plurality of observation windows and to obtain images by detecting measured light reflected from the first and second semiconductor substrates;

a distance sensor configured to detect a distance between an edge of the first chuck and an edge of the second chuck; and a control unit configured to identify the first and second alignment keys from the images of the first and second semiconductor substrates, calculate an alignment error value of the first and second semiconductor substrates, and compensate for the alignment error value by driving the first driving unit.

11. The semiconductor substrate alignment device of claim 10, wherein the alignment error value includes a primary alignment error value and a secondary alignment error value, and the control unit is configured to obtain first and second images based on standard values of the first and second semiconductor substrates, determine primary position values of the first and second alignment keys from the first and second images, determine the primary alignment error value of the first and second semiconductor substrates based on the primary position values of the first and second alignment keys, roughly align the first semiconductor substrate by controlling the first driving unit to compensate for the primary alignment error value, control a position of the first chuck to be closer to a first distance at which spontaneous bonding propagation is possible between the first and second semiconductor substrates based on a distance value of the first and second chucks measured by the distance sensor, obtain third and fourth images captured by focusing on the first and second alignment keys, determine secondary position values of the first and second alignment keys from the third and fourth images, determine the secondary alignment error value of the first and second semiconductor substrates based on the secondary position values of the first and second alignment keys, and control the first driving unit to finely align the first semiconductor substrate with the second semiconductor substrate by moving the first chuck to compensate for the secondary alignment error value.

12. The semiconductor substrate alignment device of claim 10, wherein at least one of the plurality of imaging units includes:

a body portion;

an objective lens at a front side of the body portion;

a near-infrared light source configured to emit the transmitted light through the objective lens;

an infrared camera configured to receive the measured light incident to the objective lens; and a second driving unit configured to drive the infrared camera along X, Y and Z-axes.

13. The semiconductor substrate alignment device of claim 11, wherein at least one of the plurality of imaging units includes a plurality of cameras, the plurality of cameras including a low magnification infrared camera and a high magnification infrared camera, the low magnification infrared camera configured to capture the first and second images, and the high magnification infrared camera configured to capture the third and fourth images.

14. The semiconductor substrate alignment device of claim 10, wherein the distance sensor includes first to third distance sensors, and the first to third distance sensors are spaced apart from one another along the edge of the second chuck.

15. The semiconductor substrate alignment device of claim 10, wherein the transmitted light is near-infrared light.

16. The semiconductor substrate alignment device of claim 10, wherein the plurality of imaging units include first and second imaging units, and the first and second imaging units are symmetrically to each other with respect to a center of the second chuck.

17. The semiconductor substrate alignment device of claim 11, wherein the first distance is in a range of 10 μm to 200 μm.

18. A semiconductor substrate bonding system comprising:

a first chuck configured to receive a first semiconductor substrate having a first alignment key;

a first driving unit configured to adjust an alignment position of the first semiconductor substrate;

a second chuck configured to receive a second semiconductor substrate opposing the first semiconductor substrate and having a second alignment key;

a plurality of observation windows in a region of the second chuck overlapping that of the second semiconductor substrate;

a plurality of imaging units configured to irradiate transmitted light through the plurality of observation windows and to obtain images by detecting measured light reflected from the first and second semiconductor substrates;

a distance sensor configured to detect a distance between an edge of the first chuck and an edge of the second chuck;

first and second pressing units respectively at centers of the first and second chucks, and respectively configured to press the centers of the first and second semiconductor substrates such that the first and second semiconductor substrates are brought into contact with each other and spontaneous bonding propagates between the first and second semiconductor substrates; and a control unit configured to identify the first and second alignment keys from the images of the first and second semiconductor substrates, calculate an alignment error value of the first and second semiconductor substrates, compensate for the alignment error value by driving the first driving unit, and instigate the bonding of the first and second semiconductor substrates to each other.

19. The semiconductor substrate bonding system of claim 18, wherein the alignment error value includes a primary alignment error value and a secondary alignment error value, and the control unit is configured to control a loading of the first semiconductor substrate onto the first chuck, obtain a first image by imaging the first semiconductor substrate based on a standard value of the first semiconductor substrate, determine a rough position value of the first alignment key from the first image, control a loading of the second semiconductor substrate onto the second chuck, obtain a second image by imaging the second semiconductor substrate based on a standard value of the second semiconductor substrate, determine a rough position value of the second alignment key from the second image, determine the primary alignment error value of the first and second semiconductor substrates based on the rough position values of the first and second alignment keys, control the first driving unit to roughly align the first semiconductor substrate with the second semiconductor substrate by moving the first chuck to compensate for the primary alignment error value, control a position of the first chuck to be closer to a first distance at which spontaneous bonding propagation is allowed to be performed between the first and second semiconductor substrates based on a distance value measured by the distance sensor, obtain third and fourth images imaged by focusing on surfaces of the first and second semiconductor substrates, determine fine position values of the first and second alignment keys from the third and fourth images, determine the secondary alignment error value of the first and second semiconductor substrates based on the fine position values of the first and second alignment keys, and control the first driving unit to finely align the first semiconductor substrate with the second semiconductor substrate by moving the first chuck to compensate for the secondary alignment error value.

20. The semiconductor substrate bonding system of claim 18, wherein the first and second semiconductor substrates are silicon wafers, and the transmitted light is near-infrared light.

* * * * *